United States Patent [19]
Krause et al.

[11] Patent Number: 4,924,868
[45] Date of Patent: May 15, 1990

[54] SURFACE COIL FOR A NUCLEAR MAGNETIC RESONANCE APPARATUS

[75] Inventors: Norbert Krause, Heroldsbach; Hermann Requardt, Erlangen, both of Fed. Rep. of Germany

[73] Assignee: Siemens Aktiengesellschaft, Berlin and Munich, Fed. Rep. of Germany

[21] Appl. No.: 154,314

[22] Filed: Feb. 10, 1988

[30] Foreign Application Priority Data

Feb. 17, 1987 [DE] Fed. Rep. of Germany ....... 3704996

[51] Int. Cl.$^5$ .............................................. A61B 5/05
[52] U.S. Cl. ............................ 128/653 SC; 324/318; 324/322
[58] Field of Search ............... 128/653; 324/307, 309, 324/318, 322

[56] References Cited

U.S. PATENT DOCUMENTS

| | | |
|---|---|---|
| 4,587,493 | 5/1986 | Sepponen . |
| 4,672,972 | 6/1987 | Berke ................................. 128/653 |
| 4,820,987 | 4/1989 | Mens ................................. 324/318 |

FOREIGN PATENT DOCUMENTS

| | | |
|---|---|---|
| 0171741 | 2/1986 | European Pat. Off. . |
| 0175129 | 3/1986 | European Pat. Off. . |
| WO84/00214 | 1/1984 | PCT Int'l Appl. . |
| 2159626 | 12/1985 | United Kingdom . |

*Primary Examiner*—Ruth S. Smith
*Attorney, Agent, or Firm*—Hill, Van Santen, Steadman & Simpson

[57] ABSTRACT

A surface coil for a nuclear magnetic resonance apparatus has a number of conductor sections arranged relative to each other. Switches are provided to connect the conductor sections in different combinations. Each combination outlines a differently sized area, or a different region, of the patient. The switches also connect the combination of conductor sections which is to be utilized to a tuning circuit. A single surface coil can thus be used to examine different regions of a patient without the coil having to be physically displaced. The different combinations of conductor sections, which connected, may form a rectangle which is adjacent to, or overlaps, a rectangle of unconnected sections.

10 Claims, 3 Drawing Sheets

SURFACE COIL FOR A NUCLEAR MAGNETIC RESONANCE APPARATUS

BACKGROUND OF THE INVENTION

1. Field of the Invention

The present invention relates to a surface coil of the type suitable for obtaining nuclear magnetic resonance signals from an examination subject in a nuclear magnetic resonance examination apparatus.

2. Description of the Prior Art

Nuclear magnetic resonance examination devices may use a surface coil to obtain nuclear magnetic resonance signals from the examination subject to identify spectra or images of the subject. The nuclear magnetic resonance apparatus includes a set of coils for generating a fundamental magnetic field, and a set of coils for generating gradient magnetic fields, with the patient being disposed in both the fundamental field and the gradient fields. The examination subject is irradiated via an antenna with a sequence of radio frequency pulses, causing nuclear magnetic resonance signals to arise within the examination subject. These signals are acquired by the surface coil, which is connected to an evaluation unit through a tuning circuit. Such a surface coil is disclosed, for example, in published patent application WO 84/00 214.

Surface coils are used in nuclear magnetic resonance tomography and in nuclear magnetic resonance spectroscopy when specific parts of the examination subject must be interpreted with improved signal-to-noise ratio. Specifically, in spinal column diagnosis, a compromise must be made using conventional surface coils. Large (oval) surface coils enable a large measuring field to be examined with a high penetration depth. The signal-to-noise ratio for such a large area, however, is poor. Small (generally round) surface coils have a favorable signal-to-noise ratio but permit only a small measuring field and a slight penetration depth to be examined.

To cover a large region to be examined using small surface coils with a favorble signal-to-noise ratio, it is possible to successively displace the small surface coil relative to the examination subject. In the case of spinal column examinations, however, the surface coils are generally embedded in bed cushions, so that such displacement is extremely difficult in practice.

In practice, therefore, a critical region is first localized using a large surface coil. The patient is then shifted onto a bed cushion having a small, high-resolution surface coil. Such shifting requires re-adjustment of all critical parameters. This method is therefore time consuming, and is extremely uncomfortable for the patient, particularly for patients having spinal column injuries.

SUMMARY OF THE INVENTION

It is an object of the present invention to provide a surface coil for use in nuclear magnetic resonance examinations which permits different regions, and differently sized regions, of a patient to be examined without physically displacing the coil, and without substituting a differenty sized coil.

The above object is achieved in accordance with the principles of the present invention in a surface coil consisting of a plurality of conductor sections which are connectable to each other and to a tuning circuit by a plurality of switches. Dependent on the respective states of the switches, the conductor sections are connected to the tuning unit in different conbinations. The different combinations may have different sizes, or may be displaced relative to other combinations, or both. The effective surface of the surface coil can thus be adapted to the particular requirements of different types of exminations, for example a large examination region with lower resolution, or a smaller region with higher resolution in accordance with the states of the switches. The location of the examination region can also be varied.

DESCRIPTION OF THE PREFERRED EMBODIMENTS

Figure 1:
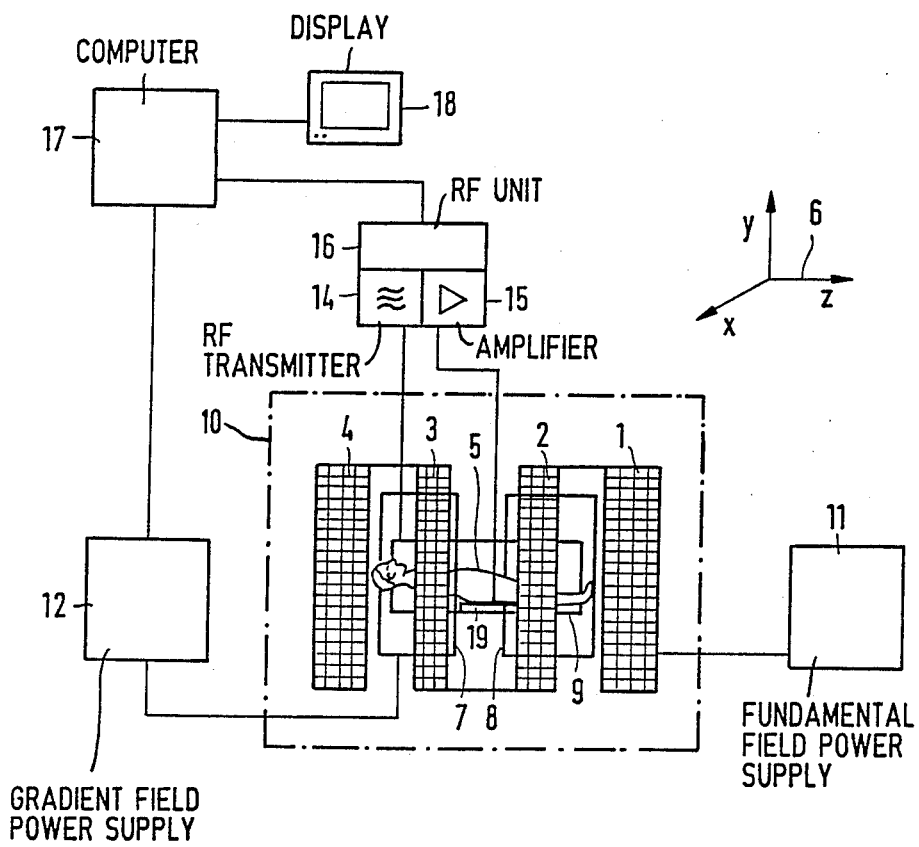
FIG. 1 is a schematic view of a nuclear magnetic resonance apparatus of the type in which the surface coil of the present invention may be used.

The basic components of a nuclear magnetic resonance apparatus, of the type in which the surface coil disclosed and claimed herein may be used, are shown in FIG. 1. The apparatus includes coils 1, 2, 3 and 4 for generating a fundamental magnetic field in which, for medical uses, a patient 5 to be examined is disposed. The patient 5 is also disposed within gradient fields respectively generated by a plurality of sets of gradient coils. These gradient fields are orthogonal, and are aligned with the x, y nd z axes as schematically indicated by the coordinate system 6. Only the gradient coils 7 and 8 are shown in FIG. 1 for the purpose of clarity. The gradient coils 7 and 8 generate a gradient field in the x-direction in combination with a pair of identical gradient coils disposed oppositely thereto. Similar sets of gradient coils (not shown) for generating a gradient field in the y-direction are disposed parallel to the patient 5 above and below the patient 5, and gradient coils for generating a gradient field in the z-direction are disposed transversely relative to the longitudinal axis of the patient 5, at the head and feet of the patient 5.

The apparatus also includes a body resonator 9 functioning as an antenna for inducing the nuclear magnetic resonance signals in the patient 5. A surface coil 19 (described in greater detail below) acquires the resulting nuclear magnetic resonance signals. The surface coil 19 may alternatively serve the dual purpose of generating the nuclear magnetic resonance signals, instead of using the body resonator 9.

The actual examination instrument in which the patient 5 is disposed is bounded by the dot-dashed lines 10. A power supply 11 is provided for operating the fundamental field coils 1 through 4, and the gradient coils are supplied by a power supply 12. A radio-frequency transmitter 14, controlled by a process computer 17, is connected to the body resonator 9. The surface coil 19 is also connected to the process computer 17 via a signal amplifier 15. A display 18 is connected to the output of the computer 17 for visually representing an image of the region being examined. The transmitter 14 and the signal amplifier 15 are part of a radio-frequency unit 16 for signal generation and registration.

Figure 2:
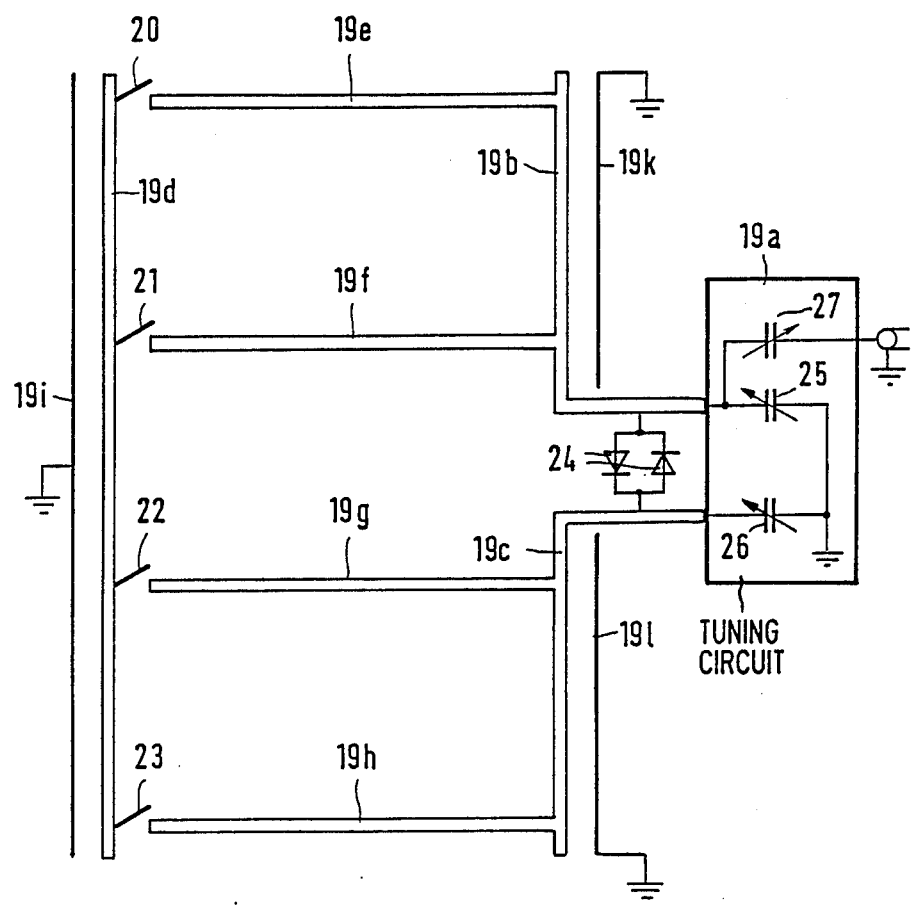
FIG. 2 is a schematic plan view of a first embodiment of a surface coil constructed in accordance with the principles of the present invention.

Further details of the surface coil 19 are shown in a first embodiment in FIG. 2. The surface coil in this embodiment includes two first conductor sections 19b and 19c which are aligned with each other and disposed symmetrically relative to a tuning circuit 19a, and are electrically connected to the tuning circuit 19a. A second conductor section 19d is provided parallel to the sections 19b and 19c. Four bridge sections 19e, 19f, 19g and 19h are provided as third conductor sections between the first conductor sections 19b and 19c, and the second conductor section 19d. The conductor sections 19e and 19f are permanently connected to the conductor section 19b, and are connected to the conductor section 19d via respective switches 20 and 21. The conductor sections 19g and 19h are permanently connected to the conductor section 19c, and are connected to the conductor section 19d via respective switches 22 and 23. A shielded line 19i, connected to ground, is parallel to the conductor section 19d. Shielded lines 19k and 19l, also connected to ground, are disposed parallel to the conductor sections 19b and 19c. The conductor sections may, for example, consist of copper tubing.

In the switching state shown in FIG. 2, the switches 20 and 23 are closed so that a large surface coil is obtained. This large surface coil, however, has only limited resolution but covers a relatively large area of the examination subject in exchange therefore. A smaller examination region having a higher resolution can be obtained by closing the switches 21 and 22. A surface coil of intermediate size is obtained by closing switches 20 and 22, or by closing switches 21 and 23. The position of the intermediate size surface coil can be varied dependent upon whether the switches 20 and 22 are closed, or whether the switches 21 and 23 are closed.

The switches 20 through 23 may, for example, be mechanical switches or electrical switches. Pin diode switches are especially suitable for radio-frequency uses. The entire surface coil can be disconnected by opening all of the switches 20 through 23 to decouple the surface coil from the body resonator 9.

Tuning of the respective combination of conductors forming the surface coil is undertaken with capacitors 25 and 26 which respectively connect the conductor sections 19b and 19c to a reference potential, and with a capacitor 27 connected in series with the feed. All of these capacitors are variable to permit tuning of the conductor combination currently in use to resonance and to adapt to the resistance of the feed. The signal is taken at the conductor section 19b via the tunable capacitor 27.

A circuit consisting of two diodes 24, connected with opposite polarity, is provided between the conductor sections 19b and 19c for protection against over-voltages.

Figure 3:
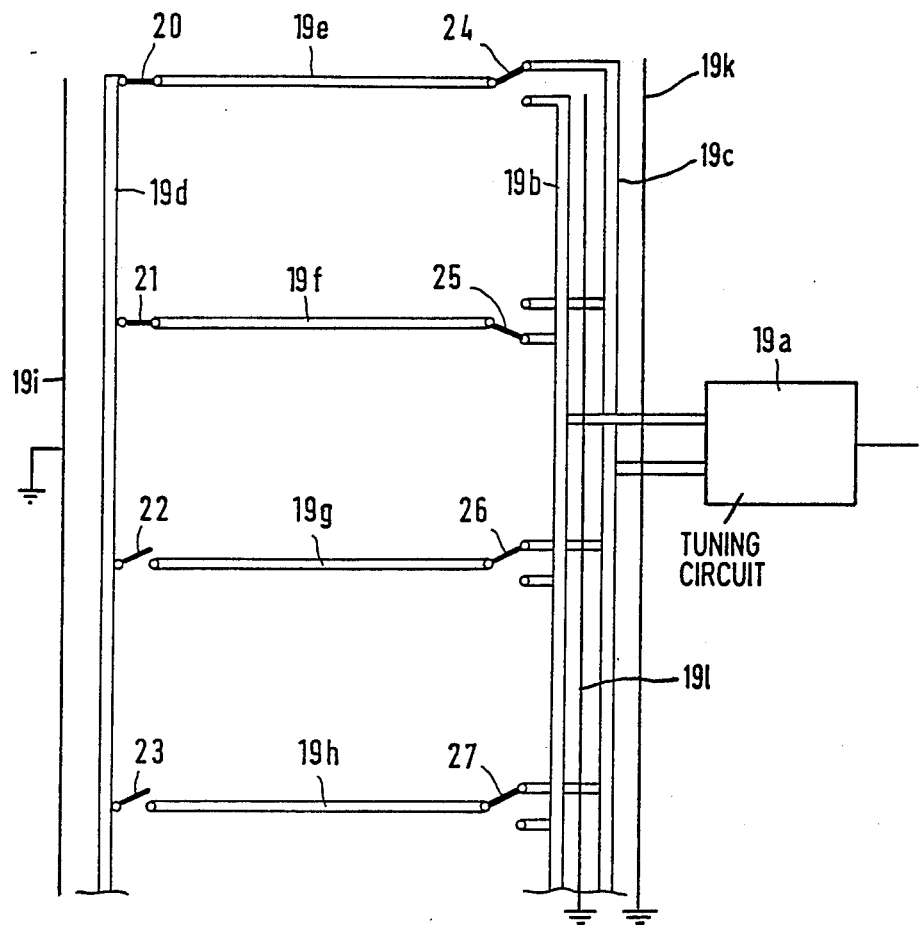
FIG. 3 is a schematic plan view of a second embodiment of a surface coil constructed in accordance with the principles of the present invention.

A further embodiment of a surface coil constructed in accordance with the principles of the present invention is shown in FIG. 3. In this embodiment, differing from the exemplary embodiment of FIG. 2, the first conductor sections 19b and 19c, which are connected to the tuning circuit 19a, are disposed parallel to each other. The third conductor sections 19e through 19h, as in the embodiment of FIG. 2, are connected to the second conductor section 19d via respective switches 20 through 23. The other end of each third conductor section 19e through 19h is selectively connectable to the conductor section 19b or to the conductor section 19c via respective switches 24 through 27.

The embodiment of FIG. 3 has the advantage of not only permitting the effective size of the surface coil to be varied, but also the position of the surface coil between the individual third conductor sections can be varied. Given the state of the switches 20, 21, 24 and 25 shown in FIG. 3, for example, the conductor sections 19e and 19f, as well as portions of the conductor sections 19b and 19c, form the surface coil. The position of the effective portion of the surface coil, and thus of the examination region, can thus be selectively shifted among the third conductor sections 19e through 19h by appropriately changing the states of switches 20 through 27 so that, for example, different regions of the spinal column can be successively examined without physically displacing the surface coil. The effective part of the surface coil at any time covers only a small area, so that a high resolution is achieved. By appropriately selecting the states of the switches 22 through 27, it is also possible to cover a larger examination region, for example, to demarcate a problem area, and then to examine this area with higher resolution in a next step.

The number and relative spacing of the third conductor sections can be adapted in accordance with the length of the overall examination region of interest, and in accordance with the desired resolution.

Although modifications and changes may be suggested by those skilled in the art it is the intention of the inventors to embody within the patent warranted hereon all changes and modifications as reasonably and properly come within the scope of their contribution to the art.

We claim as our invention:

1. In a nuclear resonance apparatus for examining a patient having means for generating a fundamental magnetic field and means for generating a plurality of gradient fields in which said patient is disposed, and means for inducing nuclear magnetic resonance signals in said patient, a surface coil device adapted to be connected to a tuning circuit for detecting said nuclear magnetic resonance signals, said surface coil device comprising:

a plurality of conductor sections arranged relative to each other and adapted for circumscribing different areas and different regions of a patient in a plurality of respective combinations; and switching means for selectively electrically connecting different groups of said plurality of conductor sections together to form said combinations so that said different areas and different regions of said patient can be examined without physical displacement of said conductor sections, said switching means adapted to electrically connect a combination so formed to said tuning circuit.

2. A surface coil device as claimed in claim 1, wherein said different areas and different regions are a plurality of interrelated rectangles.

3. A surface coil device as claimed in claim 1, wherein said plurality of conductor sections includes two co-linear first conductor sections each adapted to be connected to said tuning circuit, a second conductor section disposed parallel to said co-linear first conductor sections and a plurality of third conductor sections connected between said first conductor sections and said second conductor section, and wherein said switching means includes a plurality of switches respectively associated with each of said third conductor sections, each switch disposed so that, when closed, an electrical path in completed between one of said first conductor sections and said second conductor section via the associated third conductor section.

4. A surface coil device as claimed in claim 3, wherein said third conductor sections are respectively permanently connected to said first conductor sections, and wherein said plurality of switches includes a switch between each of said third conductor sections and said second conductor section.

5. A surface coil device as claimed in claim 3, further comprising a pair of shielded lines respectively disposed parallel to said first conductor sections, and another shielded line disposed parallel to said second conductor section.

6. A surface coil device as claimed in claim 1, wherein said plurality of conductor sections includes two first conductor sections disposed parallel to each other and each adapted for connection to said tuning circuit, a second conductor section disposed parallel to said first conductor sections, and a plurality of third conductor sections disposed between said first conductor sections and said second conductor section, and wherein said switching means includes, for each third conductor section, a first switch selectively connecting one end of said third conductor section to one of said first conductor sections, and a second switch disposed at an opposite end of the third conductor section selectively connecting said third conductor section to said second conductor section.

7. A surface coil device as claimed in claim 6, further comprising a pair of shielded lines respectively disposed parallel to said first conductor sections, and another shielded line disposed parallel to said second conductor section.

8. A surface coil device as claimed in claim 1, wherein said switch means consists of a plurality of pin diode switches.

9. In a nuclear magnetic resonance apparatus for examining a patient having means for generating a fundamental magnetic field and means for generating a plurality of gradient fields in which said patient is disposed, and means for inducing nuclear magnetic resonance signals in said patient, a surface coil device adapted to be connected to a tuning circuit for detecting said nuclear magnetic resonance signals, said surface coil device comprising:
a plurality of conductor sections arranged relative to each other and adapted for circumscribing a series of adjacent areas of a patient; and
switching means for selectively electrically connecting different ones of said conductor sections together to form a surface coil having a selected effective area and adapted for connecting said surface coil of selected effective area to said tuning circuit.

10. In a nuclear magnetic resonance apparatus for examining a patient having means for generating a fundamental magnetic field and means for generating a plurality of gradient fields in which said patient is disposed, and means for inducing nuclear magnetic resonance signals in said patient, a surface coil device adapted to be connected to a tuning circuit for detecting nuclear magnetic resonance signals, said surface coil device comprising:
a plurality of conductor sections arranged relative to each other to form a plurality of adjacent surface coil sections; and
switching means for selectively electrically connecting different groups of said sections together thereby to vary the size and location of an examination region of a patient without physical displacement of said conductor sections, and said switching means adapted for connecting the different groups to said tuning circuit.

* * * * *